(12) United States Patent
Nakagawa

(10) Patent No.: US 8,148,783 B2
(45) Date of Patent: Apr. 3, 2012

(54) SEMICONDUCTOR DEVICE

(75) Inventor: Yoshikazu Nakagawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 233 days.

(21) Appl. No.: 12/654,609

(22) Filed: Dec. 24, 2009

(65) Prior Publication Data

US 2010/0163987 A1 Jul. 1, 2010

(30) Foreign Application Priority Data

Dec. 26, 2008 (JP) ................................. 2008-334481

(51) Int. Cl.
*H01L 29/76* (2006.01)
*H01L 31/062* (2012.01)

(52) U.S. Cl. ........ 257/367; 257/409; 257/488; 257/347; 438/140; 438/454

(58) Field of Classification Search .................. 257/367, 257/347, 409, 488, E29.261; 438/140, 454
See application file for complete search history.

(56) References Cited

U.S. PATENT DOCUMENTS

| 5,455,439 | A | * | 10/1995 | Terashima et al. ............ 257/401 |
| 6,150,702 | A | * | 11/2000 | Funaki et al. .................. 257/409 |
| 6,307,232 | B1 | | 10/2001 | Akiyama et al. |

FOREIGN PATENT DOCUMENTS

JP 10-341018 A 12/1998

* cited by examiner

*Primary Examiner* — Theresa T Doan
(74) *Attorney, Agent, or Firm* — Rabin & Berdo, P.C.

(57) ABSTRACT

Semiconductor device including semiconductor layer, first impurity region on surface layer portion of semiconductor layer, body region at interval from first impurity region, second impurity region on surface layer portion of body region, field insulating film at interval from second impurity region, gate insulating film on surface of the semiconductor layer between second impurity region and field insulating film, gate electrode on gate insulating film, first floating plate as ring on field insulating film, and second floating plate as ring on same layer above first floating plate. First and second floating plates formed by at least three plates so that peripheral lengths at centers in width direction thereof are entirely different from one another, alternately arranged in plan view so that one having relatively smaller peripheral length is stored in inner region of one having relatively larger peripheral length, and formed to satisfy relational expression: L/d=constant.

6 Claims, 10 Drawing Sheets

SEMICONDUCTOR DEVICE

BACKGROUND OF THE INVENTION

1. Field of the Invention

The present invention relates to a semiconductor device.

2. Description of Related Art

In general, an LDMOSFET is known as a high withstand voltage device employed for a power MOSFET.

FIG. 10 is a schematic sectional view of a semiconductor device including a conventional LDMOSFET.

A semiconductor device 101 includes a thick-film SOI substrate 102. The thick-film SOI substrate 102 has a structure obtained by laminating an $N^-$-type active layer 105 made of silicon on a silicon substrate 103 through a BOX layer 104 made of silicon oxide.

In the active layer 105, a deep trench 106 having a depth reaching the BOX layer 104 from the surface thereof is formed to pass through the active layer 105 in the thickness direction. The inner side surface of the deep trench 106 is covered with a silicon oxide film 107.

The inner side of the silicon oxide film 107 is filled up with polysilicon 108. Thus, an element forming region 109 surrounded by the deep trench 106 and dielectrically isolated from the periphery thereof by the BOX layer 104 and the silicon oxide film 107 is formed on the active layer 105.

An LDMOSFET 110 is formed in the element forming region 109. More specifically, a P-type body region 111 is formed in the active layer 105 in the element forming region 109. The body region 111 is formed along the side surface of the deep trench 106 over the entire thickness of the active layer 105.

The region of the element forming region 109 other than the body region 111 is an $N^-$-type drift region 112.

On a surface layer portion of the body region 111, an $N^+$-type source region 113 and a $P^+$-type body contact region 114 are formed to be adjacent to each other on positions separated from the drift region 112. On a surface layer portion of the drift region 112, an $N^+$-type drain region 115 is formed on a position separated from the body region 111.

On the surface of the drift region 112, a field oxide film 116 is formed on a portion between the drain region 115 and the body region 111 at an interval from the body region 111.

Between the source region 113 and the field oxide film 116, a gate oxide film 117 is formed on the surface of the active layer 105. A gate electrode plate 118 is formed on the gate oxide film 117. The gate electrode plate 118 is opposed to the body region 111 and the drift region 112 through the gate oxide film 117.

On the field oxide film 116, a field plate 119 integral with the gate electrode plate 118 is formed to extend onto the peripheral edge portion of the field oxide film 116.

Four first floating plates 120 are formed on the field oxide film 116. The four first floating plates 120 are in the form of rings, having a constant width, similar to one another. The four first floating plates 120 are arranged to form a quadruple ring surrounding a drain electrode plate 122 (described later) connected to the drain region 115 and to divide the space between the drain electrode plate 122 and the field plate 119 at regular intervals. The first floating plates 120 are opposed to the drift region 112 through the field oxide film 116.

A source electrode plate 121 extending over the source region 113 and the body contact region 114 is formed on the body region 111. The source electrode plate 121 is connected to the source region 113 and the body contact region 114.

The drain electrode plate 122 is formed on the drain region 115. The drain electrode plate 122 is connected to the drain region 115.

The upper portion of the thick-film SOI substrate 102 is covered with a first interlayer dielectric film 123 made of silicon oxide.

Five second floating plates 124 are formed on the first interlayer dielectric film 123. The second floating plates 124 are in the form of rings, having a constant width, similar to the first floating plates 120. The five second floating plates 124 are dividedly arranged one by one on a central portion between the drain electrode plate 122 and the first floating plate 120 adjacent thereto, central portions between the adjacent ones of the first floating plates 120, and a central portion between the field plate 119 and the first floating plate 120 adjacent thereto respectively. In other words, the five second floating plates 124 are arranged at regular intervals while the second floating plates 124 and the first floating plates 120 are alternately arranged in plan view between the drain electrode plate 122 and the field plate 119.

The upper portion of the first interlayer dielectric film 123 is covered with a second interlayer dielectric film 125 made of silicon oxide.

A source contact hole 126 facing the source electrode plate 121 is formed in the first interlayer dielectric film 123 and the second interlayer dielectric film 125 to pass through the same. Further, a drain contact hole 127 facing the drain electrode plate 122 is formed in the first interlayer dielectric film 123 and the second interlayer dielectric film 125 to pass through the same.

A source wire 128 and a drain wire 129 are formed on the second interlayer dielectric film 125. The source wire 128 is connected to the source electrode plate 121 through a source contact plug 130 embedded in the source contact hole 126. The drain wire 129 is connected to the drain electrode plate 122 through a drain contact plug 131 embedded in the drain contact hole 127.

A current can be fed between the source region 113 and the drain region 115 (between a source and a drain) through the drift region 112 by grounding the source wire 128 and controlling the potential of the gate electrode plate 118 while applying a positive-polarity voltage (a drain voltage) to the drain wire 129 thereby forming a channel in the vicinity of the interface between the body region 111 and the gate oxide film 117.

SUMMARY OF THE INVENTION

In a high withstand voltage device represented by the LDMOSFET, a high voltage is applied between a source and a drain, and hence a countermeasure for ensuring the withstand voltage is required.

As such a countermeasure, the four annular first floating plates 120 similar to one another are provided on the field oxide film 116 in the semiconductor device 101. Further, the five annular second floating plates 124 similar to one another are provided on the first interlayer dielectric film 123. Thus, 10 capacitors having counter electrodes defined by the drain electrode plate 122 and the field plate 119 as well as the second floating plates 124 and the first floating plates 120 alternately arranged therebetween in plan view between the plates adjacent to one another are formed in operation of the LDMOSFET 110 (voltage application to the drain wire 129).

The second floating plates 124 and the first floating plates 120 are alternately arranged at regular intervals between the drain electrode plate 122 and the field plate 119, whereby the capacitances of all capacitors are equalized with one another.

Thus, a uniform electric field is formed between the counter electrodes of each capacitor, and the potential distribution in the drift region 112 is uniformized due to the influence by the electric field. The potential distribution is so uniformized that local field concentration between the source and the drain can be canceled, whereby the withstand voltage of the device can be expectedly improved.

However, the four first floating plates 120 are different in size from one another, and the five second floating plates 124 are also different in size from one another. In the aforementioned structure, therefore, the total capacitances of the capacitors cannot be equalized with one another although the capacitances per unit length in the peripheral direction of each floating plate can be equalized with one another in all capacitors. Consequently, the electric field between the counter electrodes of each capacitor not uniformized in practice, and the potential distribution in the drift region 112 cannot be uniformized.

An object of the present invention is to provide a semiconductor device capable of uniformizing potential distribution between a first impurity region and a second impurity region (between a source and a drain, for example).

The foregoing and other objects, features and effects of the present invention will become more apparent from the following detailed description of the embodiments with reference to the attached drawings.

DETAILED DESCRIPTION OF PREFERRED EMBODIMENTS

Figure 1:
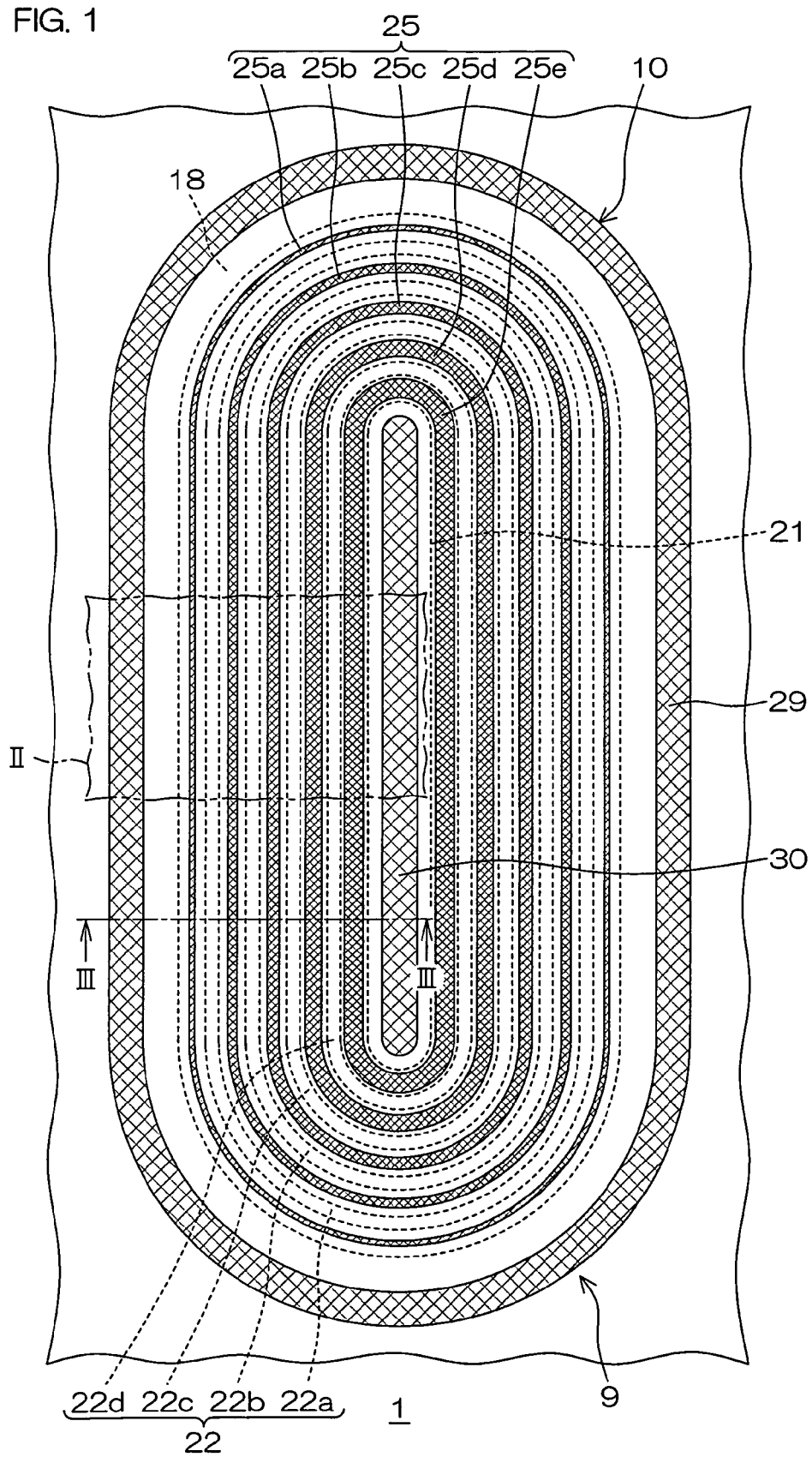
FIG. 1 is a schematic plan view of a semiconductor device according to a first embodiment of the present invention.

A semiconductor device according to an embodiment of the present invention includes: a semiconductor layer made of a first conductivity type semiconductor material; a first conductivity type first impurity region, formed on a surface layer portion of the semiconductor layer, having an impurity concentration higher than the impurity concentration in the semiconductor layer; a second conductivity type body region formed on the surface layer portion of the semiconductor layer at an interval from the first impurity region; a first conductivity type second impurity region, formed on a surface layer portion of the body region, having an impurity concentration higher than the impurity concentration in the semiconductor layer; a field insulating film formed on a portion of the surface of the semiconductor layer between the first impurity region and the second impurity region at an interval from the second impurity region; a gate insulating film formed on the surface of the semiconductor layer between the second impurity region and the field insulating film; a gate electrode formed on the gate insulating film; a first floating plate provided in the form of a ring having a constant width on the field insulating film; and a second floating plate provided in the form of a ring having a constant width on the same layer above the first floating plate, wherein the first floating plate and the second floating plate are formed by not less than three in total so that the peripheral lengths at the centers in the width direction thereof are entirely different from one another, alternately arranged in plan view so that the one having a relatively smaller peripheral length is stored in an inner region of the one having a relatively larger peripheral length, and formed to satisfy the relational expression: $L/d$=constant (L: the outer periphery of the inner one of the first and second floating plates adjacent to each other in plan view, d: the distance between the outer periphery of the plate defining L and the inner periphery of the first or second floating plate adjacent to the plate to be opposed to the outer periphery thereof).

According to the structure, the second conductivity type body region and the first conductivity type first impurity region having the impurity concentration higher than the impurity concentration in the semiconductor layer are formed on the surface layer portion of the semiconductor layer at an interval from each other. The first conductivity type second impurity region having the impurity concentration higher than the impurity concentration in the semiconductor layer is formed on the surface layer portion of the body region. Further, the field insulating film is formed on the portion of the surface of the semiconductor layer between the first impurity region and the second impurity region at an interval from the second impurity region. The gate insulating film is formed on the surface of the semiconductor layer between the second impurity region and the field insulating film, and the gate electrode is formed on the gate insulating film.

A current can be fed between the second impurity region and the first impurity region (between the first impurity region and the second impurity region) through a portion of the semiconductor layer between the body region and the first impurity region by grounding the second impurity region and controlling the potential of the gate electrode while applying a positive-polarity voltage to the first impurity region thereby forming a channel in the vicinity of the interface between the body region and the gate insulating film, for example.

In the semiconductor device, the first floating plate in the form of a ring having a constant width is formed on the field insulating film. Further, the second floating plate in the form of a ring having a constant width is formed on the same layer above the first floating plate. The first floating plate and the second floating plate are formed by not less than three in total, so that the peripheral lengths at the centers in the width direction thereof are entirely different from one another.

The first floating plate and the second floating plate are alternately arranged in plan view so that the one having a relatively smaller peripheral length is stored in an inner region of the one having a relatively larger peripheral length. Thus, at least two capacitors having counter electrodes defined by the first and second floating plates adjacent to each other in plan view are formed on the field insulating film.

If an electric field generated between the counter electrodes of each capacitor formed on the field insulating film is uniform, the potential distribution in a portion of the semiconductor layer located under the counter electrodes can be uniformized.

In the semiconductor device, therefore, the first floating plate and the second floating plate are formed to satisfy L/d=constant, where L and d are defined as follows:

L: the outer periphery of the inner one of the first and second floating plates adjacent to each other in plan view d: the distance between the outer periphery of the plate defining L and the inner periphery of the first or second floating plate adjacent to the plate to be opposed to the outer periphery thereof The total capacitance C of each capacitor formed on the field insulating film is the sum of the capacitance $\Delta C = \in \cdot \Delta S/d$ per small section $\Delta L$ of the outer periphery L of the inner plate in each capacitor ($\Delta S$: a small area of the outer peripheral surface of the inner plate per $\Delta L$), and expressed as $C = \in \cdot S/d$. $\Delta S$ expressing the area of the outer peripheral surface of the inner plate per $\Delta L$ is proportionate to $\Delta L$, and hence S expressing the sum of $\Delta S$ is proportionate to L expressing the sum of $\Delta L$.

Based on the condition where the first floating plate and the second floating plate satisfy L/d=constant, therefore, S/d=constant is deduced. In the plurality of capacitors having the counter electrodes defined by the first and second floating plates having entirely different peripheral lengths, therefore, the total capacitances can be entirely equalized with one another.

Consequently, an electric field generated between the counter electrodes of each capacitor can be uniformized, whereby the potential distribution between the first impurity region and the second impurity region can be uniformized, and the withstand voltage can be improved.

In the semiconductor device, the width of the first floating plate having a relatively larger peripheral length may be smaller than the width of the first floating plate having a relatively smaller peripheral length.

According to the structure, the width of the first floating plate having a relatively larger peripheral length is smaller than the width of the first floating plate having a relatively smaller peripheral length.

Thus, the distance between the outer periphery of the second floating plate arranged therebetween in plan view and the inner periphery of the first floating plate having a relatively larger peripheral length (i.e., the value d in the above relational expression) can be rendered greater than the distance between the outer periphery of the first floating plate having a relatively smaller peripheral length and the inner periphery of the second floating plate (i.e., the value d in the above relational expression). Therefore, the above relational expression: L/d=constant can be satisfied by adjusting the difference in L between the capacitors by setting d to a proper value.

In this case, the widths of all of the second floating plates may be equal to one another, and the second floating plates may be arranged at regular intervals.

In the semiconductor device, the width of the second floating plate having a relatively larger peripheral length may be smaller than the width of the second floating plate having a relatively smaller peripheral length.

According to the structure, the width of the second floating plate having a relatively larger peripheral length is smaller than the width of the second floating plate having a relatively smaller peripheral length.

Thus, the distance between the outer periphery of the first floating plate arranged therebetween in plan view and the inner periphery of the second floating plate having a relatively larger peripheral length (i.e., the value d in the above relational expression) can be rendered greater than the distance between the outer periphery of the second floating plate having a relatively smaller peripheral length and the inner periphery of the first floating plate (i.e., the value d in the above relational expression). Therefore, the above relational expression: L/d=constant can be satisfied by adjusting the difference in L between the capacitors by setting d to a proper value.

In this case, the widths of all of the first floating plates may be equal to one another, and the first floating plates may be arranged at regular intervals.

In the semiconductor device, further, the widths of all of the first floating plates may be equal to one another, the widths of all of the second floating plates may be equal to one another, and the widths of the first floating plates and the widths of the second floating plates may be equal to one another.

Embodiments of the present invention are now described in detail with reference to the attached drawings.

Figure 2:
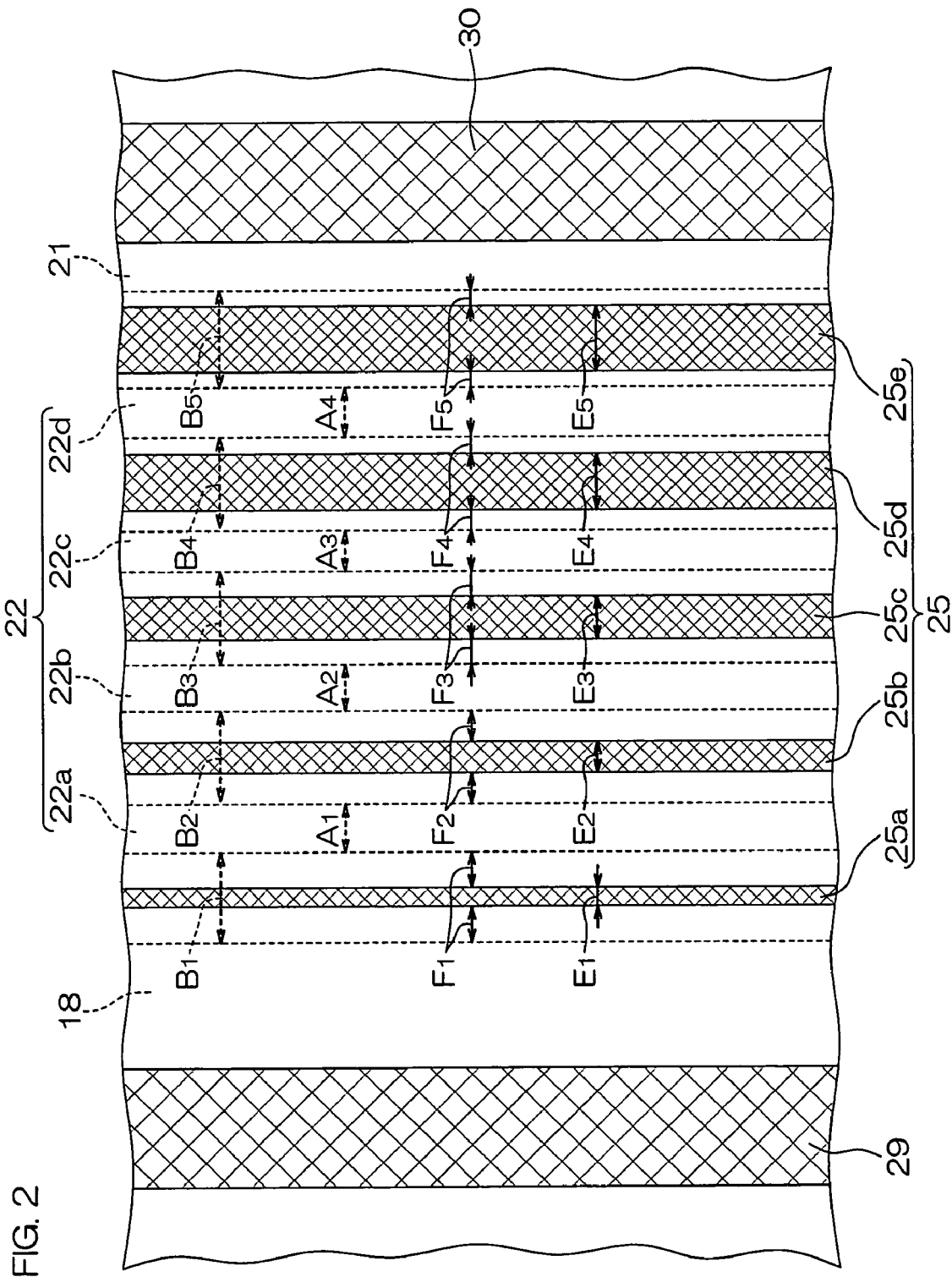
FIG. 2 is an enlarged view of a region surrounded by a box II in FIG. 1.
Figure 3:
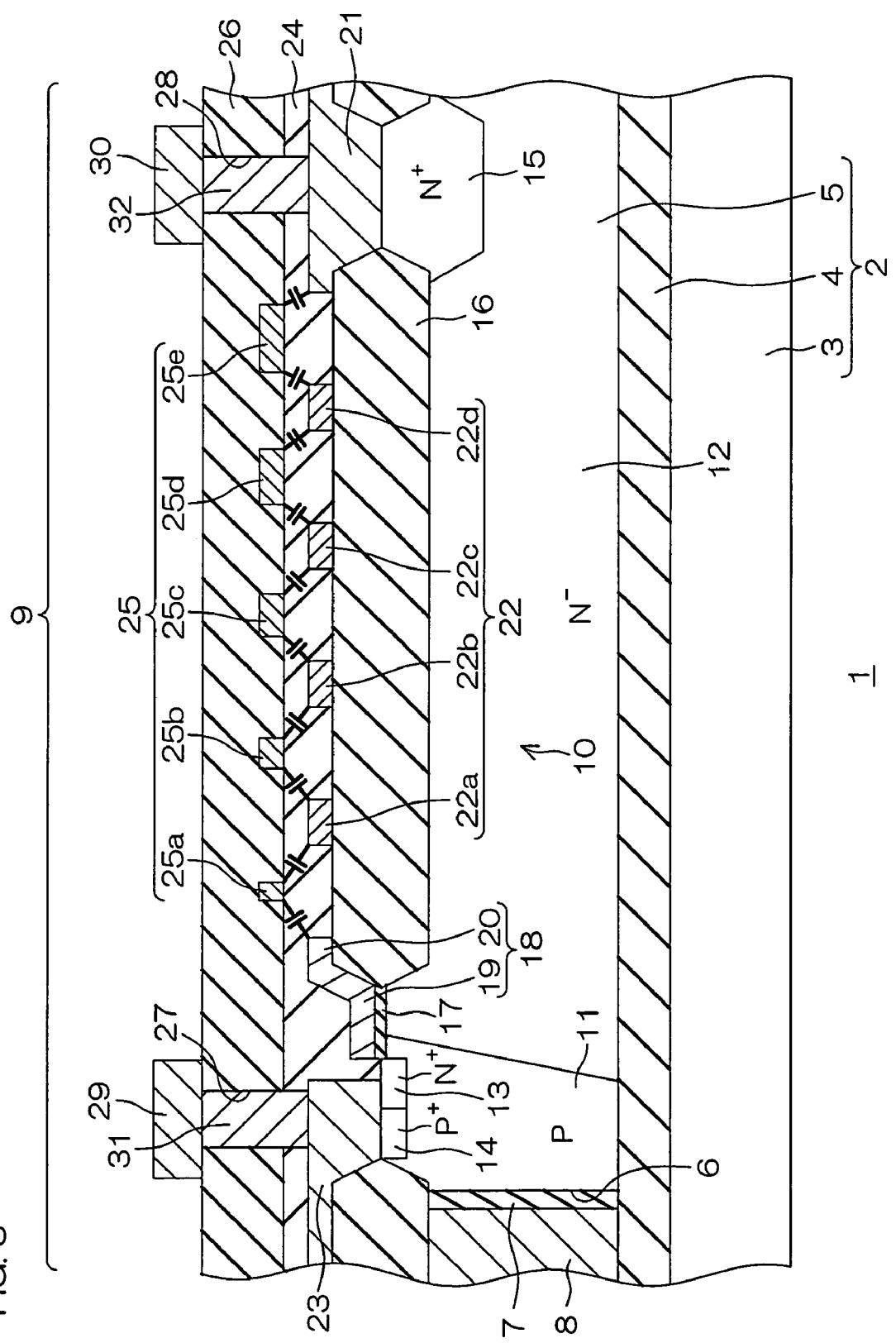
FIG. 3 is a sectional view of the semiconductor device taken along a line III-III in FIG. 1.

FIG. 1 is a schematic plan view of a semiconductor device according to a first embodiment of the present invention. FIG. 2 is an enlarged view of a region surrounded by a box II in FIG. 1. FIG. 3 is a sectional view of the semiconductor device taken along a line in FIG. 1.

A semiconductor device 1 according to the first embodiment includes a thick-film SOI substrate 2. The thick-film SOI substrate 2 has a structure obtained by laminating an active layer 5 as an $N^-$-type semiconductor layer made of silicon on a silicon substrate 3 through a BOX layer 4 made of silicon oxide.

The thickness of the BOX layer 4 is 1 to 6 μm, for example. The thickness of the active layer 5 is 10 to 50 μm, for example. The N-type impurity concentration in the active layer 5 is $10^{13}$ to $10^{16}$ $cm^{-3}$, for example.

A deep trench 6 in the form of a rectangular ring in plan view is formed in the active layer 5 to pass through the same in the thickness direction. In other words, the active layer 5 is provided with the deep trench 6 in the form of a rectangular ring in plan view having a depth reaching the BOX layer 4 from the surface thereof.

The inner side surfaces of the deep trench 6 are covered with a pair of silicon oxide films 7. The thickness of the silicon oxide films 7 is 0.2 to 1.5 μm, for example.

The inner sides of the pair of silicon oxide films 7 are filled up with polysilicon 8. Thus, an element forming region 9 surrounded by the deep trench 6 and dielectrically isolated from the periphery thereof by the BOX layer 4 and the silicon oxide films 7 is formed on the active layer 5.

An LDMOSFET 10 is formed in the element forming region 9. More specifically, the LDMOSFET 10 prepared by aligning unit cells having a gate length direction defined by the right-and-left direction in FIGS. 1 and 3 along the direction is formed in the element forming region 9. Each of FIGS. 1 and 3 shows only one of the plurality of unit cells.

The LDMOSFET 10 includes a P-type body region 11 and an $N^-$-type drift region 12 in the active layer 5.

The body region 11 is provided in the form of a ring along the side surface of the deep trench 6 every unit cell, with a thickness reaching the BOX layer 4 from the surface of the active layer 5. In other words, the body region 11 is formed over the entire thickness of the active layer 5. The body region 11 has an impurity concentration of $10^{15}$ to $10^{18}$ $cm^{-3}$, for example.

The drift region 12 is a region, where the conductivity type of the active layer 5 is maintained in the active layer 5, surrounded by the body region 11. The drift region 12 has an impurity concentration of $10^{13}$ to $10^{16}$ $cm^{-3}$, for example.

On a surface layer portion of the body region 11, an $N^+$-type source region 13 as a second impurity region and a $P^+$-type body contact region 14 are formed to be adjacent to (in contact with) each other on positions separated from the drift region 12. The source region 13 and the body contact region 14 are formed over the entire periphery of the body region 11 in plan view. The impurity concentration in the source region 13, higher than that in the drift region 12, is $10^{19}$ to $10^{22}$ cm$^{-3}$, for example.

On a surface layer portion of the drift region 12, a drain region 15 as a first impurity region is formed on a position separated from the body region 11. The drain region 15 linearly extends in a vertical direction (the direction may hereinafter be simply referred to as "vertical direction") along the gate width orthogonal to a transverse direction (the direction may hereinafter be simply referred to as "transverse direction") along the gate length at a generally central portion between body regions 11 opposed to each other in the transverse direction. The thickness of the drain region 15 reaches a central portion of the active layer 5 in the thickness direction from the surface of the active layer 5. The impurity concentration in the drain region 15, higher than that in the drift region 12, is $10^{19}$ to $10^{22}$ cm$^{-3}$, for example.

On the surface of the drift region 12, a field insulating film 16 is formed on a portion between the drain region 15 and the source region 13 at an interval from the body region 11, i.e., at an interval from the source region 13 in plan view. The field insulating film 16 is in the form of a ring surrounding the drain region 15. The field insulating film 16 is made of silicon oxide, and formed by LOCOS, for example. The thickness of the field insulating film 16 is 0.5 to 2 μm, for example.

On the surface of the active layer 5, an annular gate insulating film 17 along the outer peripheral edge of the field insulating film 16 is formed over the body region 11 and the drift region 12 between the source region 13 and the field insulating film 16. The gate insulating film 17 is made of silicon oxide, for example.

A gate electrode plate 18 extending over the gate insulating film 17 and the field insulating film 16 is formed on the active layer 5. The gate electrode plate 18 is in the form of a ring covering the overall region of the surface (the upper surface) of the gate insulating film 17. The gate electrode plate 18 has the same width (a constant width) orthogonal to the peripheral direction on any position in the peripheral direction. The gate electrode plate 18 integrally has an electrode portion 19 and a field plate portion 20.

The electrode portion 19 is formed on the gate insulating film 17, and opposed to the body region 11 and the drift region 12 through the gate insulating film 17. On the other hand, the field plate portion 20 extends onto the outer peripheral edge of the field insulating film 16.

A drain electrode plate 21 is formed on the drain region 15 in the active layer 5. The drain electrode plate 21 is linearly formed to be in contact with the overall region of the surface of the linear drain region 15 exposed from the field insulating film 16, and the peripheral edge thereof extends onto the inner peripheral edge of the field insulating film 16.

A source electrode plate 23 is formed on the body region 11 in the active layer 5. The source electrode plate 23 is in the form of a ring, similar to the gate electrode plate 18, in contact with the annular source region 13 and the body contact region 14 exposed from the field insulating film 16.

Four first floating plates 22 are formed on the field insulating film 16 separately from the gate electrode plate 18. All of the four first floating plates 22 are formed on the field insulating film 16 (the same layer).

Each first floating plate 22 is in the form of a ring similar to the gate electrode plate 18. Therefore, each first floating plate 22 has the same width (a constant width) orthogonal to the peripheral direction on any position in the peripheral direction.

All lengths (first peripheral lengths) in the peripheral direction at the centers of the four first floating plates 22 in the width direction are different from one another, and smaller than a length (a gate peripheral length) in the peripheral direction at the center of the gate electrode plate 18 in the width direction.

In the description of the first embodiment, the first floating plates 22 having the different first peripheral lengths may be particularly distinguished from one another as first floating plates 22a to 22d successively from that having the largest first peripheral length.

Similarity ratios of the first floating plates 22 are so set that the similarity ratio between a reference first floating plate 22 and a plate larger by one stage than the plate with reference to the first peripheral length is identical to the similarity ratio between the reference first floating plate 22 and a plate smaller by one stage than the plate with reference to the first peripheral length.

With reference to the first floating plate 22b, for example, the similarity ratio between the first peripheral length of the first floating plate 22b and that of the first floating plate 22a larger by one stage than the plate 22b is set to be identical to the similarity ratio between the first peripheral length of the first floating plate 22b and that of the first floating plate 22c smaller by one stage than the plate 22b.

Widths $A_1$ to $A_4$ of the first floating plates 22a to 22d are entirely equal to one another. In other words, the relational expression: $A_1=A_2=A_3=A_4$ is satisfied.

The four first floating plates 22 are so arranged that all plates 22a to 22d surround the drain electrode plate 21 in an inner region of the gate electrode plate 18 in plan view.

Further, the four first floating plates 22 are so arranged that the first floating plate 22 having a relatively smaller first peripheral length is stored in an inner region of the first floating plate 22 having a relatively larger first peripheral length. More specifically, the first floating plate 22a having the largest first peripheral length is arranged on a side closest to the gate electrode plate 18. The first floating plate 22b smaller by one stage than the first floating plate 22a is arranged to be stored in the inner region of the first floating plate 22a. The first floating plates 22c and 22d are also arranged to be stored in the inner regions of the plates larger by single stages than the same respectively. Thus, each first floating plate 22 is opposed to the drift region 12 through the field insulating film 16.

The four first floating plates 22 are so arranged as to divide the space between the gate electrode plate 18 and the drain electrode plate 21 at regular intervals. In other words, the intervals between the inner peripheries of the plates having relatively larger peripheral lengths and the outer peripheries of the plates having relatively smaller peripheral lengths are equal to one another.

More specifically, the interval $B_1$ between the inner periphery of the gate electrode plate 18 and the outer periphery of the first floating plate 22a, the interval $B_2$ between the inner periphery of the first floating plate 22a and the outer periphery of the first floating plate 22b, the interval $B_3$ between the inner periphery of the first floating plate 22b and the outer periphery of the first floating plate 22c, the interval $B_4$ between the inner periphery of the first floating plate 22c and the outer periphery of the first floating plate 22d and the interval $B_5$ between the inner periphery of the first floating plate 22d and the outer periphery of the drain electrode plate 21 are entirely equal to one another. In other words, the relational expression: $B_1=B_2=B_3=B_4=B_5$ is satisfied.

The upper portion of the thick-film SOI substrate 2 is covered with a first interlayer dielectric film 24 made of silicon oxide.

Five second floating plates 25 are formed on the first interlayer dielectric film 24. All of the five second floating plates 25 are formed on the first interlayer dielectric film 24. In other words, all of the five second floating plates 25 are formed on the same layer above the first floating plates 22.

Each second floating plate 25 is in the form of a ring similar to the gate electrode plate 18. Therefore, all second floating plates 25 are similar to all first floating plates 22. Each second floating plate 25 has the same width (a constant width) orthogonal to the peripheral direction on any position in the peripheral direction.

All lengths (second peripheral lengths) in the peripheral direction at the centers of the five second floating plates 25 in the width direction are different from one another, and also different from the first peripheral lengths of all first floating plates 22. Further, all of the second peripheral lengths of the five second floating plates 25 are smaller than the gate peripheral length of the gate electrode plate 18.

In the description of the first embodiment, the second floating plates 25 having the different second peripheral lengths may be particularly distinguished from one another as second floating plates 25a to 25e successively from that having the largest second peripheral length.

In the second floating plates 25, the width of the second floating plate 25 having a relatively larger second peripheral length is smaller than that of the second floating plate 25 having a relatively smaller second peripheral length.

With reference to the second floating plate 25b, for example, the width of the second floating plate 25b is smaller than that of the second floating plate 25c having the second peripheral length smaller by one stage than that of the plate 25b. In other words, widths $E_1$ to $E_5$ of the second floating plates 25a to 25e satisfy the relational expression: $E_1<E_2<E_3<E_4<E_5$.

The five second floating plates 25 are dividedly arranged one by one between the plates 18, 21 and 22 adjacent to one another in plan view respectively. Thus, the first floating plates 22 and the second floating plates 25 are alternately arranged between the gate electrode plate 18 and the drain electrode plate 21 in plan view.

More specifically, the second floating plate 25a having the largest second peripheral length is arranged on a side closer to the gate electrode plate 18, i.e., between the gate electrode plate 18 and the first floating plate 22a. The second floating plate 25b smaller by one stage than the second floating plate 25a is arranged between the first floating plate 22a and the first floating plate 22b. The second floating plates 25c to 25e are also arranged between the plates 21 and 22 adjacent to one another in plan view respectively.

The five second floating plates 25 are so arranged that all of the centers thereof in the width direction coincide with those of the spaces between the lower plates 18, 21 and 22 in the width direction.

The upper portion of the first interlayer dielectric film 24 is covered with a second interlayer dielectric film 26 made of silicon oxide.

A source contact hole 27 facing the source electrode plate 23 is formed in the first interlayer dielectric film 24 and the second interlayer dielectric film 26 to pass through the same. Further, a drain contact hole 28 facing the drain electrode plate 21 is also formed in the first interlayer dielectric film 24 and the second interlayer dielectric film 26 to pass through the same.

A source wire 29 and a drain wire 30 are formed on the second interlayer dielectric film 26. The source wire 29 is in the form of a ring along the shape of the source electrode plate 23 on an outer region of the gate electrode plate 18 in plan view. Further, the source wire 29 is connected to the source electrode plate 23 through a source contact plug 31 embedded in the source contact hole 27.

The drain wire 30 is in the form of a straight line along the shape of the drain electrode plate 21 in an inner region of the second floating plate 25e in plan view. Further, the drain wire 30 is connected to the drain electrode plate 21 through a drain contact plug 32 embedded in the drain contact hole 28.

A current can be fed between the source region 13 and the drain region 15 (between a source and a drain) through the drift region 12 by grounding the source wire 29 and controlling the potential of the gate electrode plate 18 while applying a positive-polarity voltage (a drain voltage) to the drain wire 30 thereby forming a channel in the vicinity of the interface between the body region 11 and the gate insulating film 17.

In the semiconductor device 1, as hereinabove described, the four annular first floating plates 22 having the constant width are formed on the field insulating film 16. Further, the five annular second floating plates 25 having the constant width are formed on the first interlayer dielectric film 24 above the first floating plates 22. The first peripheral lengths of all first floating plates 22 and the second peripheral lengths of all second floating plates 25 are different from one another.

The first floating plates 22 and the second floating plates 25 are so alternately arranged in plan view that the plates having relatively smaller peripheral lengths (first and second peripheral lengths) are stored in the inner regions of the plates having relatively larger peripheral lengths (first and second peripheral lengths) between the gate electrode plate 18 and the drain electrode plate 21 in plan view.

Thus, capacitors having counter electrodes defined by the plates 18, 21 and 22 adjacent to one another in plan view are formed on the field insulating film 16. More specifically, 10 capacitors in total are formed with eight capacitors having counter electrodes defined by the first floating plates 22 and the second floating plates 25, a capacitor having counter electrodes defined by the gate electrode plate 18 and the second floating plate 25a, and a capacitor having counter electrodes defined by the drain electrode plate 21 and the second floating plate 25e.

If an electric field generated between the counter electrodes of each capacitor formed on the field insulating film 16 is uniform, the potential distribution in a portion of the drift region 12 located under the counter electrodes can be uniformized.

In the semiconductor device 1, therefore, the first floating plates 22 and the second floating plates 25 are formed to satisfy L/d=constant, where the values are defined as follows:

L: the outer periphery of the inner one of the first floating plate 22 and the second floating plate 25 adjacent to each other in plan view d: the distance between the outer periphery of the plate defining L and the inner periphery of the first floating plate 22 or the second floating plate 25 adjacent to the plate to be opposed to the outer periphery thereof More specifically, the first floating plates 22, in which the widths $A_1$ to $A_4$ of all plates 22a to 22d are equal to one another, are arranged to divide the space between the gate electrode plate 18 and the drain electrode plate 21 at regular intervals.

In the second floating plates 25, on the other hand, the width of the second floating plate 25 having a relatively larger second peripheral length is smaller than the width of the second floating plate 25 having a relatively smaller second peripheral length. Further, the second floating plates 25 are arranged to be closer to the gate electrode plate 18 successively from the second floating plate 25 having a relatively larger second peripheral length. In addition, the second floating plates 25 are so arranged that all centers thereof in the width direction coincide with the centers of the spaces between the lower plates 18, 21 and 22 in the width direction.

Thus, the distance between the counter electrodes of each capacitor in plan view can be increased in proportion to the peripheral lengths of the plates forming the counter electrodes.

More specifically, it is assumed that $F_1$ represents the distance between the second floating plate 25a and the gate electrode plate 18 as well as the first floating plate 22a. Further, it is assumed that $F_2$ represents the distance between the second floating plate 25b and the first floating plates 22a and 22b, $F_3$ represents the distance between the second floating plate 25c and the first floating plates 22b and 22c, $F_4$ represents the distance between the second floating plate 25d and the first floating plates 22c and 22d, and $F_5$ represents the distance between the second floating plate 25e and the first floating plate 22d as well as the drain electrode plate 21. In the semiconductor device 1, the relational expression: $F_1 > F_2 > F_3 > F_4 > F_5$ can be satisfied in this case.

Therefore, the above relational expression: L/d=constant can be satisfied by adjusting the differences in L (the outer peripheries of the plates) between the capacitors by setting $F_1$ to $F_5$ to proper values.

The total capacitance C of each capacitor formed on the field insulating film 16 is the sum of the capacitance $\Delta C = \in \cdot \Delta S/d$ per small section $\Delta L$ of the outer periphery L of the inner plate in each capacitor ($\Delta S$: a small area of the outer peripheral surface of the inner floating plate per $\Delta L$), and expressed as $C = \in \cdot S/d$. $\Delta S$ expressing the area of the outer peripheral surface of the inner floating plate per $\Delta L$ is proportionate to $\Delta L$, and hence S expressing the sum of $\Delta S$ is proportionate to L expressing the sum of $\Delta L$.

Based on the condition where the first floating plates 22 and the second floating plates 25 satisfy L/d=constant, therefore, S/d=constant is deduced. In the plurality of capacitors having the counter electrodes defined by the first floating plates 22 and the second floating plates 25 having entirely different peripheral lengths (first and second peripheral lengths), therefore, the total capacitances can be entirely equalized with one another.

Consequently, the electric field generated between the counter electrodes of each capacitor can be uniformized, whereby the potential distribution between the source and the drain can be uniformized. Therefore, the withstand voltage can be improved.

Figure 4:
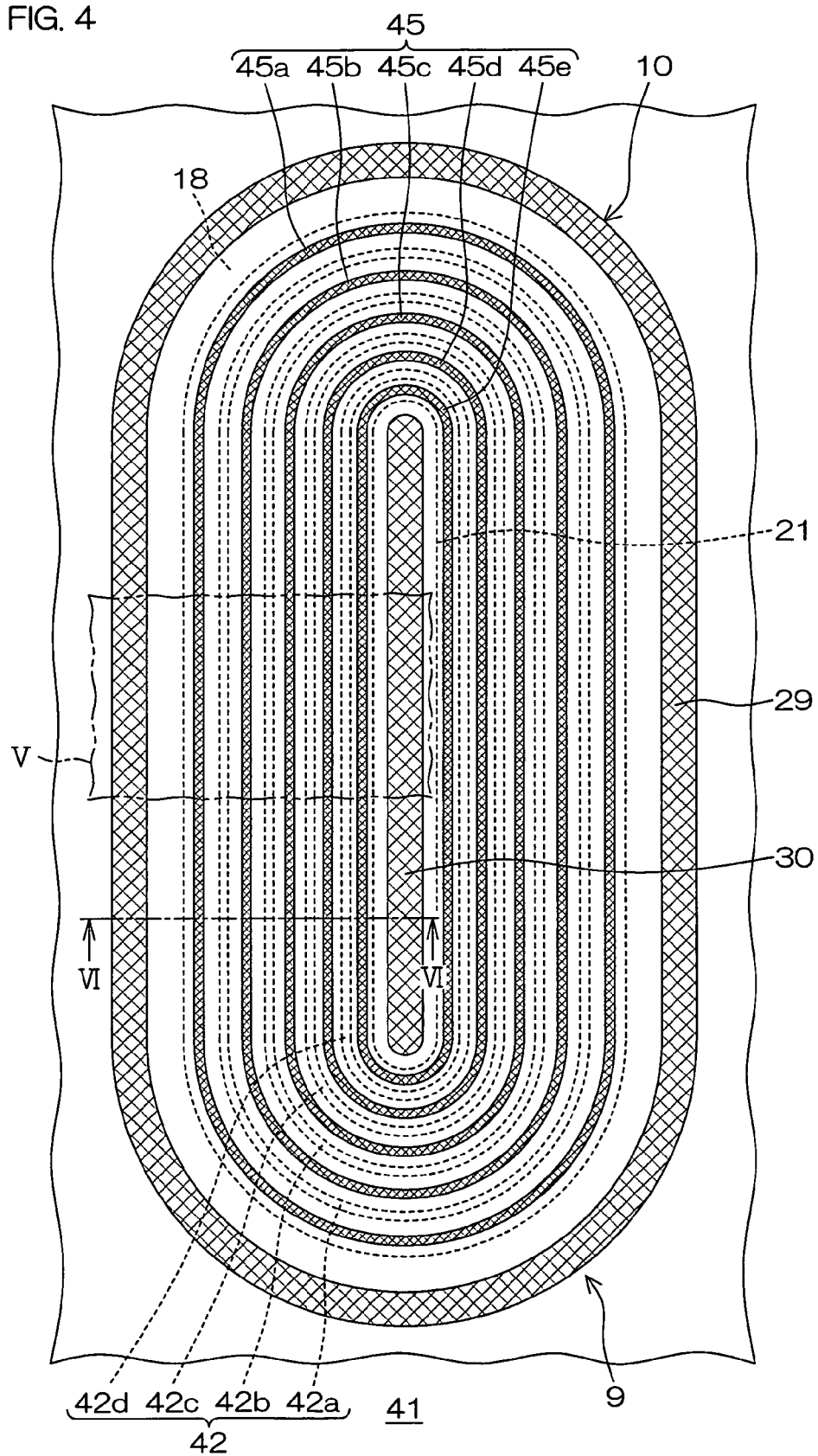
FIG. 4 is a schematic plan view of a semiconductor device according to a second embodiment of the present invention.
Figure 5:
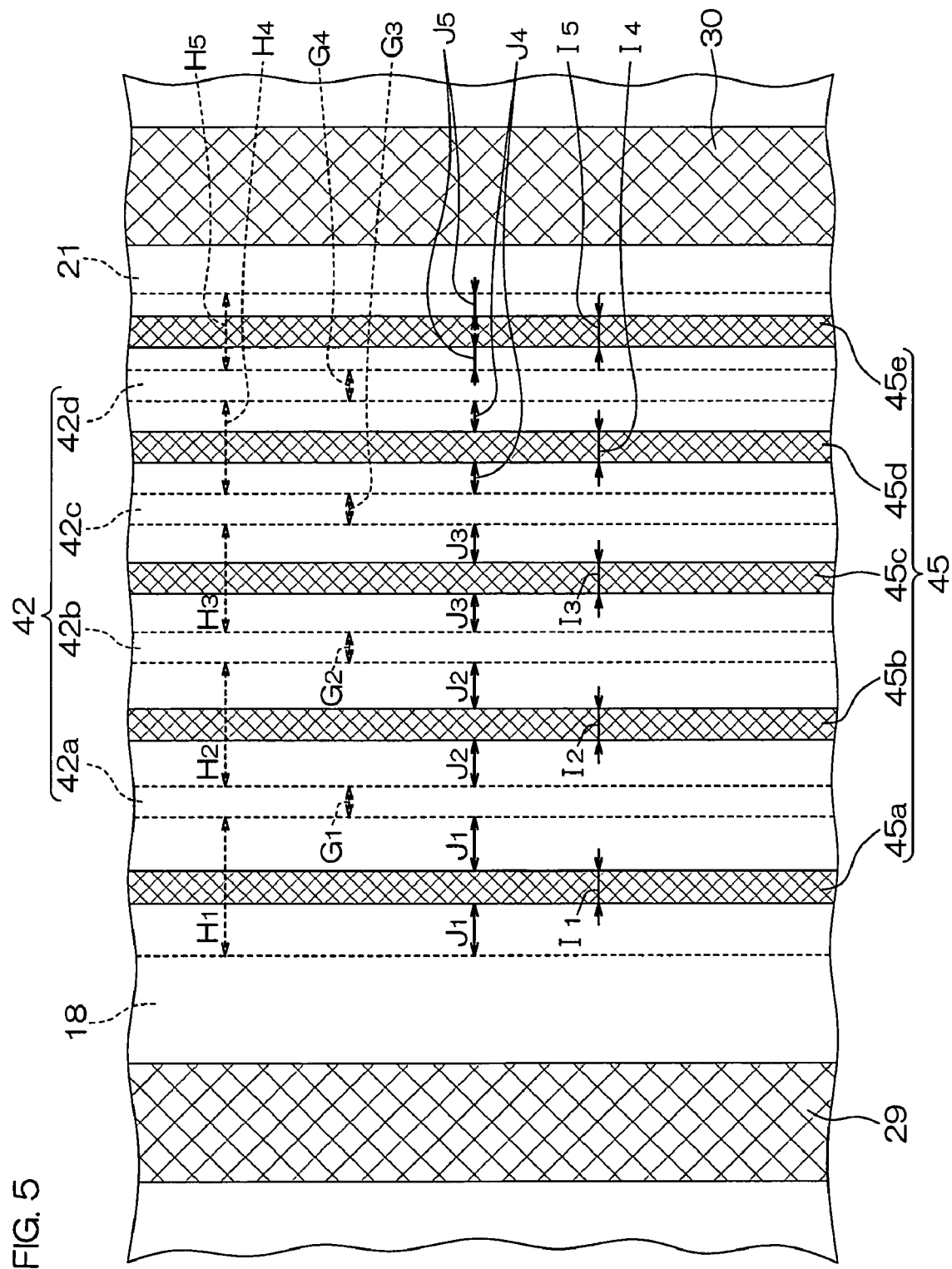
FIG. 5 is an enlarged view of a region surrounded by a box V in FIG. 4.
Figure 6:
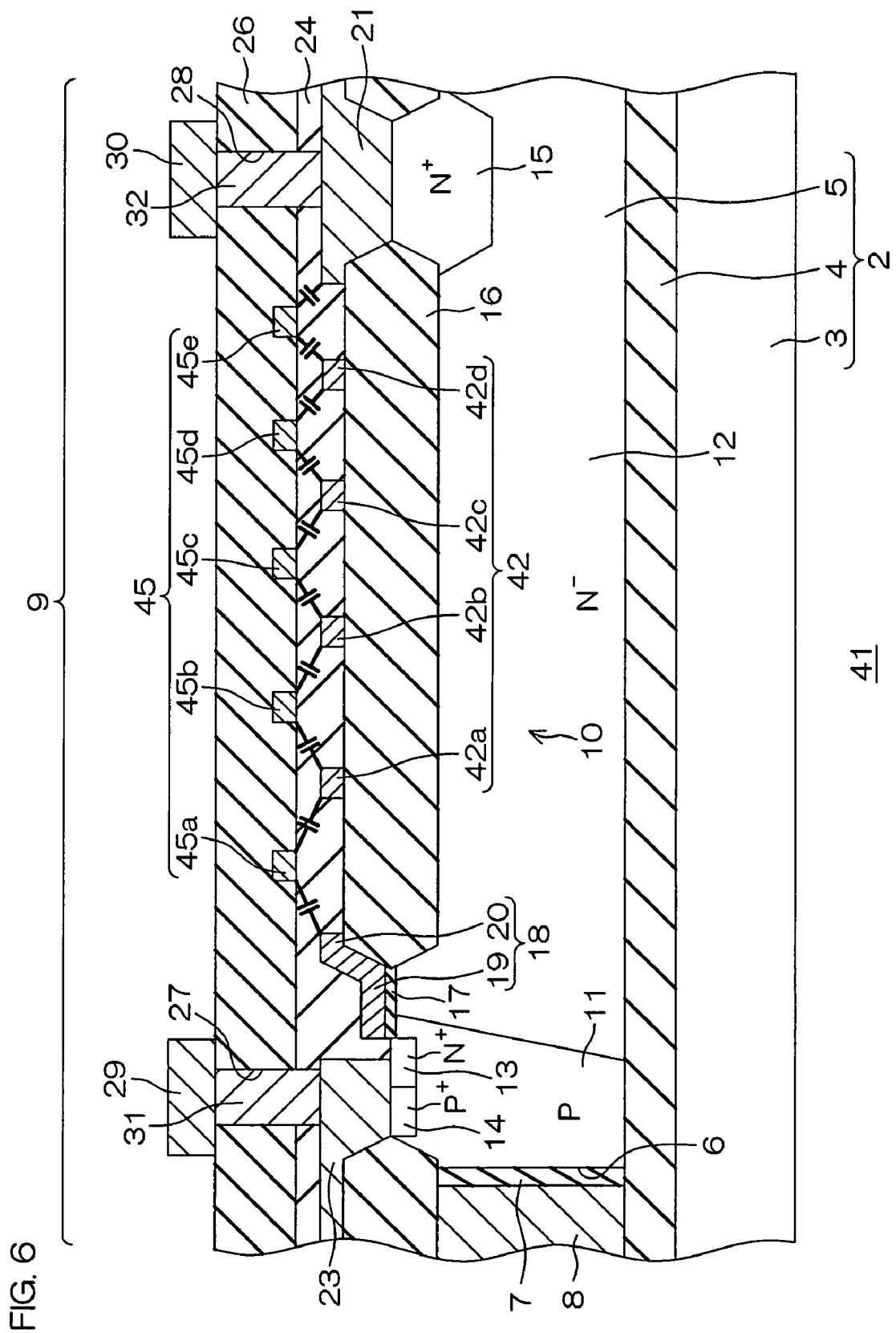
FIG. 6 is a sectional view of the semiconductor device taken along a line VI-VI in FIG. 4.

FIG. 4 is a schematic plan view of a semiconductor device according to a second embodiment of the present invention. FIG. 5 is an enlarged view of a region surrounded by a box V in FIG. 4. FIG. 6 is a sectional view of the semiconductor device taken along a line VI-VI in FIG. 4. Referring to FIGS. 4 to 6, portions corresponding to those shown in FIGS. 1 to 3 are denoted by the same reference numerals. In the following, detailed description is omitted as to the portions denoted by the same reference numerals.

In semiconductor device 41 according to the second embodiment, four first floating plates 42 are formed on a field insulating film 16 separately from a gate electrode plate 18. All of the four first floating plates 42 are formed on the field insulating film 16 (the same layer).

Each first floating plate 42 is in the form of a ring similar to the gate electrode plate 18. Therefore, each first floating plate 42 has the same width (a constant width) orthogonal to the peripheral direction on any position in the peripheral direction.

All lengths (first peripheral lengths) in the peripheral direction at the centers of the four first floating plates 42 in the width direction are different from one another, and smaller than a length (a gate peripheral length) in the peripheral direction at the center of the gate electrode plate 18 in the width direction.

In the description of the second embodiment, the first floating plates 42 having the different first peripheral lengths may be particularly distinguished from one another as first floating plates 42a to 42d successively from that having the largest first peripheral length.

Widths $G_1$ to $G_4$ of the first floating plates 42a to 42d are entirely equal to one another. In other words, the relational expression: $G_1 = G_2 = G_3 = G_4$ is satisfied.

The four first floating plates 42 are so arranged that all plates 42a to 42d surround a drain electrode plate 21 in an inner region of the gate electrode plate 18 in plan view.

Further, the four first floating plates 42 are so arranged that the first floating plate 42 having a relatively smaller first peripheral length is stored in an inner region of the first floating plate 42 having a relatively larger first peripheral length. More specifically, the first floating plate 42a having the largest first peripheral length is arranged on a side closest to the gate electrode plate 18. The first floating plate 42b smaller by one stage than the first floating plate 42a is arranged to be stored in the inner region of the first floating plate 42a. The first floating plates 42c and 42d are also arranged to be stored in the inner regions of the plates larger by single stages than the same respectively. Thus, each first floating plate 42 is opposed to a drift region 12 through the field insulating film 16.

The four first floating plates 42 are arranged between the gate electrode plate 18 and the drain electrode plate 21 so that the intervals therebetween are increased in the direction toward the gate electrode plate 18 along the surface of the field insulating film 16.

For example, the four first floating plates 42 are so arranged that the interval between the outer periphery of a reference first floating plate 42 and the inner periphery of the first floating plate 42 larger by one stage than the plate is greater than the interval between the inner periphery of the reference first floating plate 42 and the outer periphery of the first floating plate 42 smaller by one stage than the plate.

More specifically, with reference to the first floating plate 42b, the four first floating plates 42 are so arranged that the interval $H_2$ between the outer periphery of the first floating plate 42b and the inner periphery of the first floating plate 42a is greater than the interval $H_3$ between the inner periphery of the first floating plate 42b and the outer periphery of the first floating plate 42c.

In the semiconductor device 41, further, five second floating plates 45 are formed on a first interlayer dielectric film 24. All of the five second floating plates 45 are formed on the first interlayer dielectric film 24. In other words, all of the second floating plates 45 are formed on the same layer above the first floating plates 42.

Each second floating plate 45 is in the form of a ring similar to the gate electrode plate 18. Therefore, all second floating plates 45 are similar to the first floating plates 42. Each second floating plate 45 has the same width (a constant width) orthogonal to the peripheral direction on any position in the peripheral direction.

All lengths (second peripheral lengths) in the peripheral direction at the centers of the five second floating plates 45 in the width direction are different from one another, and also different from the first peripheral lengths of all first floating plates 42. Further, all of the second peripheral lengths of the five second floating plates 45 are smaller than the gate peripheral length of the gate electrode plate 18.

In the description of the second embodiment, the second floating plates 45 having the different second peripheral lengths may be particularly distinguished from one another as second floating plates 45a to 45e successively from that having the largest second peripheral length.

Widths $I_1$ to $I_5$ of the second floating plates 45a to 45e are entirely equal to one another, and also equal to the widths $G_1$ to $G_4$ of the first floating plates 42a to 42d. In other words, the widths of all first floating plates 42 are equal to one another, the widths of all second floating plates 45 are equal to one another, and the widths of the first floating plates 42 and those of the second floating plates 45 are equal to one another. Namely, the relational expression: $G_1=G_2=G_3=G_4=I_1=I_2=I_3=I_4=I_5$ is satisfied.

The five second floating plates 45 are dividedly arranged one by one between the plates 18, 21 and 22 adjacent to one another in plan view. Thus, the first floating plates 42 and the second floating plates 45 are alternately arranged in plan view between the gate electrode plate 18 and the drain electrode plate 21.

More specifically, the second floating plate 45a having the largest second peripheral length is arranged on a side closer to the gate electrode plate 18, i.e., between the gate electrode plate 18 and the first floating plate 42a. The second floating plate 45b smaller by one stage than the second floating plate 45a is arranged between the first floating plate 42a and the first floating plate 42b. The second floating plates 45c to 45e are also arranged between the plates 21 and 42 adjacent to one another in plan view respectively.

The five second floating plates 45 are so arranged that all of the centers thereof in the width direction coincide with those of the spaces between the lower plates 18, 21 and 42 in the width direction.

In the semiconductor device 41, as hereinabove described, the widths of all first floating plates 42 are equal to one another, the widths of all second floating plates 45 are equal to one another, and the widths of the first floating plates 42 and those of the second floating plates 45 are equal to one another.

Further, the first floating plates 42 are arranged between the gate electrode plate 18 and the drain electrode plate 21 so that the intervals therebetween are increased in the direction toward the gate electrode plate 18 along the surface of the field insulating film 16.

On the other hand, the five second floating plates 45 are so arranged that all of the centers thereof in the width direction coincide with those of the spaces between the lower plates 18, 21 and 42 in the width direction.

Thus, the distance between counter electrodes of each capacitor in plan view can be increased in proportion to the peripheral lengths of the plates forming the counter electrodes.

More specifically, it is assumed that $J_1$ represents the distance between the second floating plate 45a and the gate electrode plate 18 as well as the first floating plate 42a. Further, it is assumed that $J_2$ represents the distance between the second floating plate 45b and the first floating plates 42a and 42b, $J_3$ represents the distance between the second floating plate 45c and the first floating plates 42b and 42c, $J_4$ represents the distance between the second floating plate 45d and the first floating plates 42c and 42d, and $J_5$ represents the distance between the second floating plate 45e and the first floating plate 42d as well as the drain electrode plate 21. In the semiconductor device 41, the relational expression: $J_1>J_2>J_3>J_4>J_5$ can be satisfied in this case.

Therefore, the above relational expression: L/d=constant can be satisfied by adjusting the differences in L (the outer peripheries of the plates) between the capacitors by setting $J_1$ to $J_5$ to proper values.

In a plurality of capacitors having counter electrodes defined by the first floating plates 42 and the second floating plates 45 all having different peripheral lengths (first peripheral lengths and second peripheral lengths), therefore, total capacitances can be entirely equalized with one another.

Consequently, an electric field generated between the counter electrodes of each capacitor can be uniformized, whereby the potential distribution between a source and a drain can be uniformized. Therefore, the withstand voltage can be improved.

Figure 7:
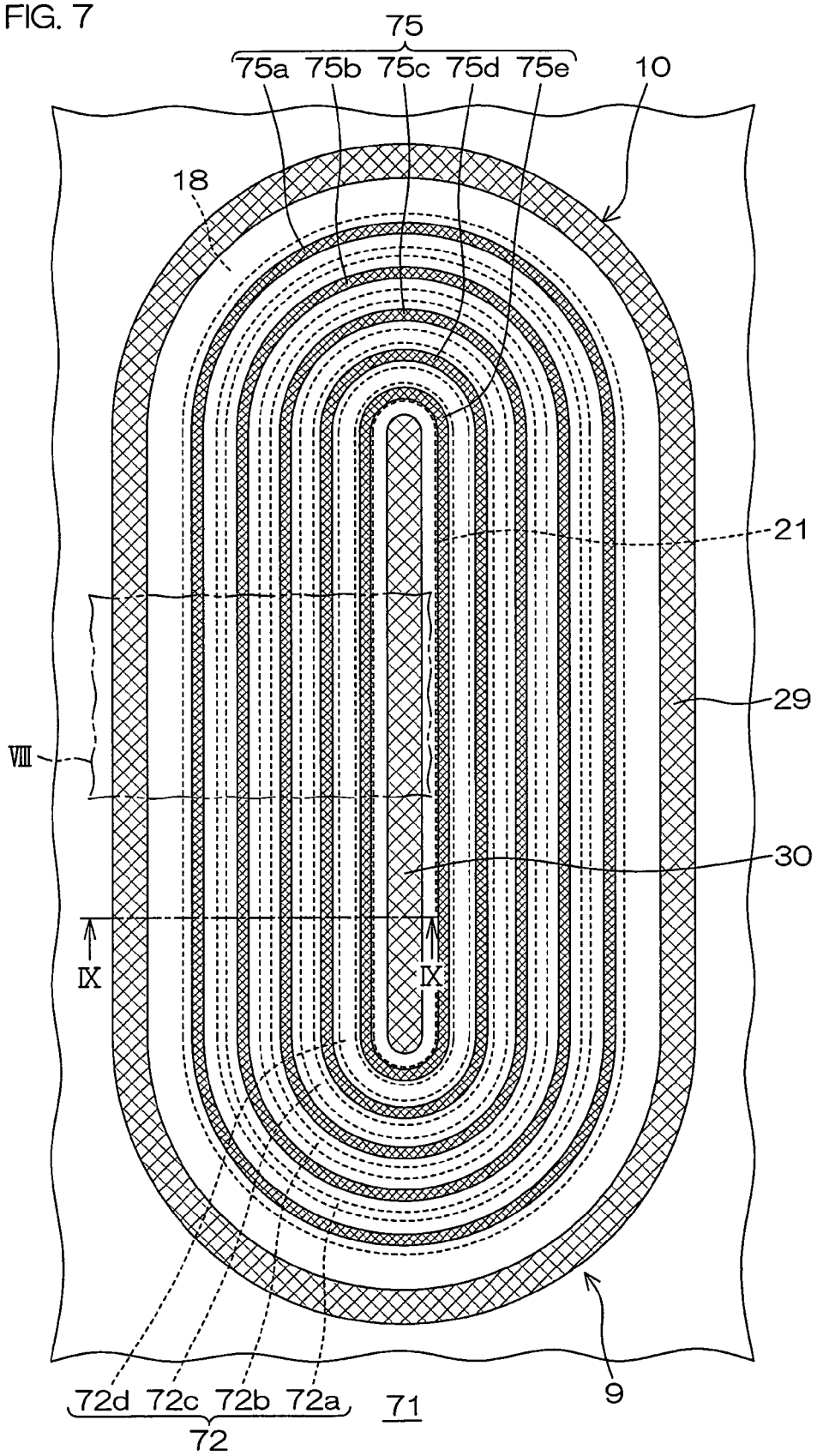
FIG. 7 is a schematic plan view of a semiconductor device according to a third embodiment of the present invention.

FIG. 7 is a schematic plan view of a semiconductor device according to a third embodiment of the present invention.

Figure 8:
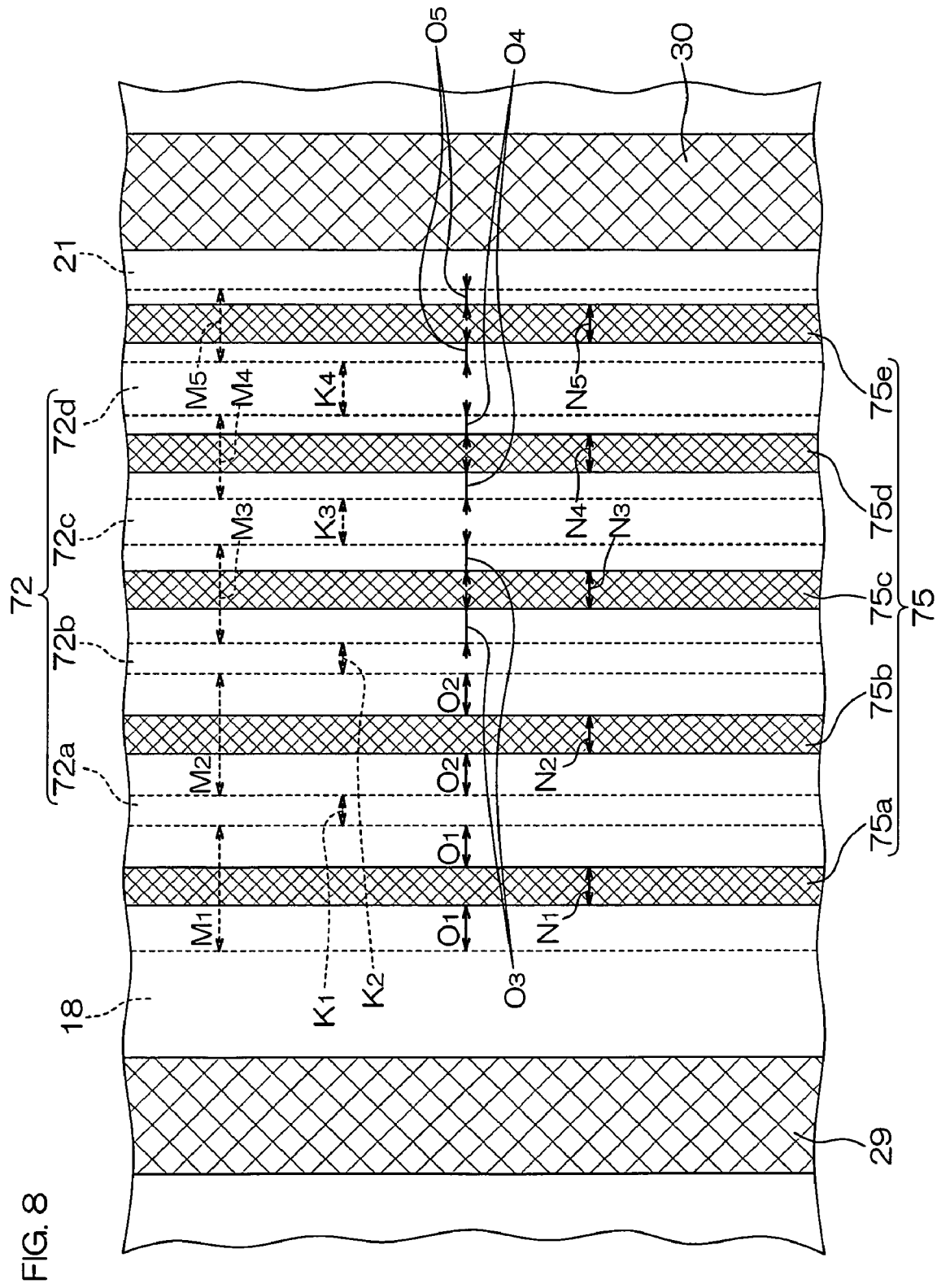
FIG. 8 is an enlarged view of a region surrounded by a box VIII-VIII in FIG. 7.
Figure 9:
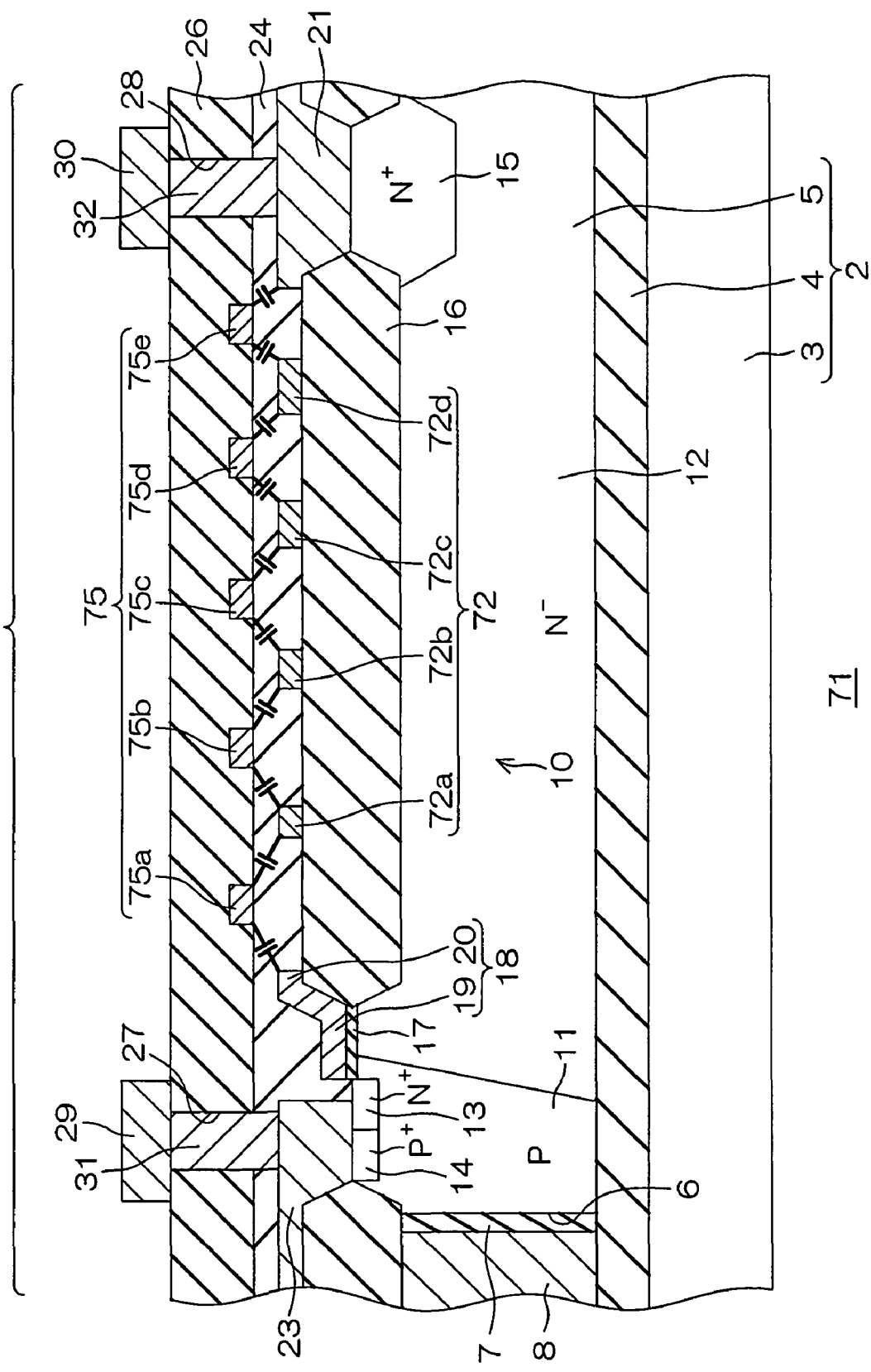
FIG. 9 is a sectional view of the semiconductor device taken along a line IX-IX in FIG. 7.
Figure 10:
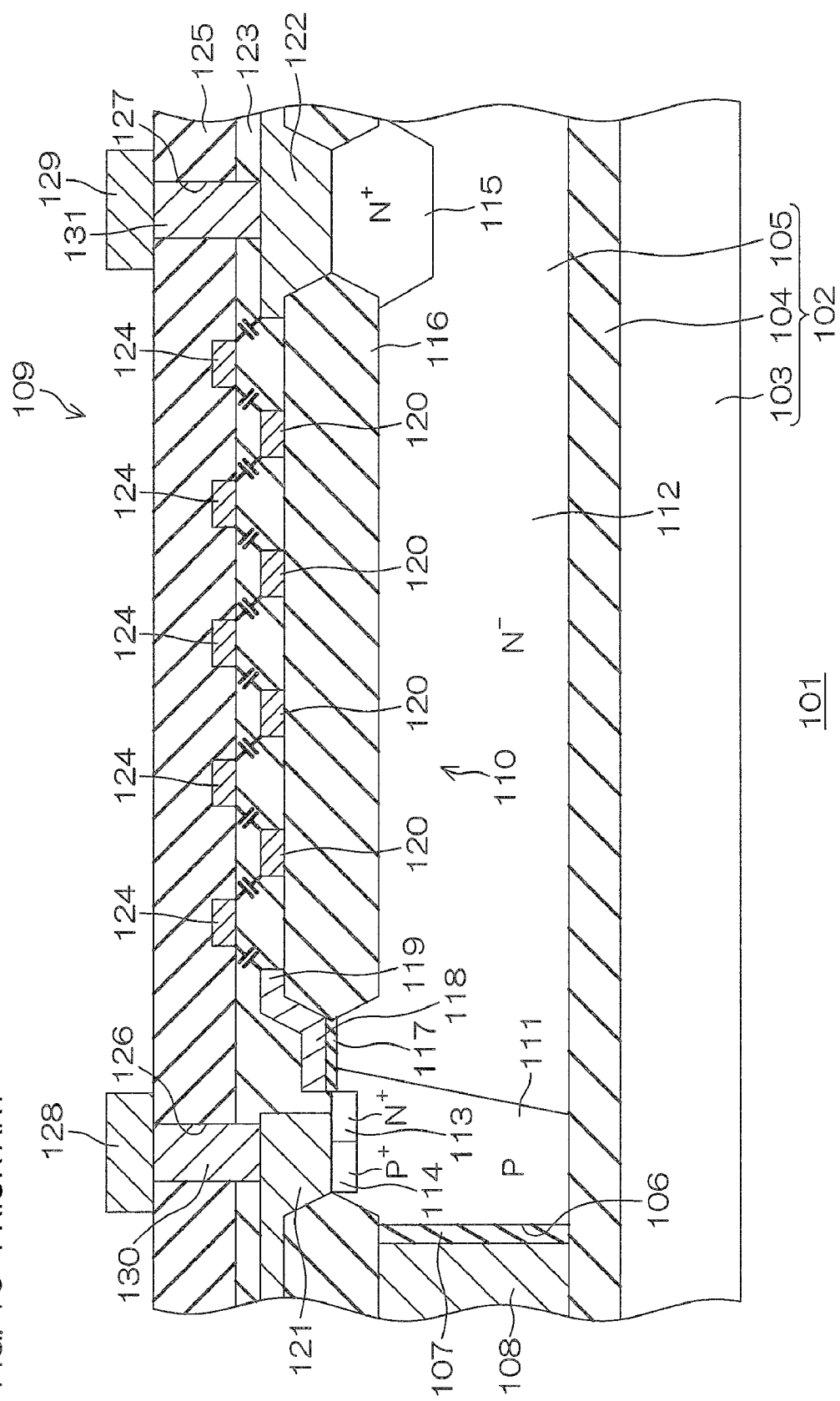
FIG. 10 is a schematic sectional view of a semiconductor device including a conventional LDMOSFET.

FIG. 8 is an enlarged view of a region surrounded by a box VIII-VIII in FIG. 7. FIG. 9 is a sectional view of the semiconductor device taken along a line IX-IX in FIG. 7. Referring to FIGS. 7 to 9, portions corresponding to those shown in FIGS. 1 to 3 are denoted by the same reference numerals. In the following, detailed description is omitted as to the portions denoted by the same reference numerals.

In a semiconductor device 71 according to the third embodiment, four first floating plates 72 are formed on a field insulating film 16 separately from a gate electrode plate 18. All of the first floating plates 72 are formed on the field insulating film 16 (the same layer).

Each first floating plate 72 is in the form of a ring similar to the gate electrode plate 18. Therefore, each first floating plate 72 has the same width (a constant width) orthogonal to the peripheral direction on any position in the peripheral direction.

All lengths (first peripheral lengths) in the peripheral direction at the centers of the four first floating plates 72 in the width direction are different from one another, and smaller than a length (a gate peripheral length) in the peripheral direction at the center of the gate electrode plate 18 in the width direction.

In the description of the third embodiment, the first floating plates 72 having the different first peripheral lengths may be particularly distinguished from one another as first floating plates 72a to 72d successively from that having the largest first peripheral length.

In the first floating plates 72, the width of the first floating plate 72 having a relatively larger first peripheral length is smaller than the width of the first floating plate 72 having a relatively smaller first peripheral length.

With reference to the first floating plate 72b, for example, the width of the first floating plate 72b is smaller than the width of the first floating plate 72c having the first peripheral length smaller by one stage than that of the plate 72b. In other words, widths $K_1$ to $K_4$ of the first floating plates 72a to 72d satisfy the relational expression: $K_1<K_2<K_3<K_4$.

The four first floating plates 72 are so arranged that all plates 72a to 72d surround a drain electrode plate 21 in an inner region of the gate electrode plate 18 in plan view.

Further, the four first floating plates 72 are so arranged that the first floating plate 72 having a relatively smaller first peripheral length is stored in an inner region of the first floating plate 72 having a relatively larger first peripheral length. More specifically, the first floating plate 72a having the largest first peripheral length is arranged on a side closest to the gate electrode plate 18. The first floating plate 72b smaller by one stage than the first floating plate 72a is arranged to be stored in the inner region of the first floating plate 72a. The first floating plates 72c and 72d are also arranged to be stored in the inner regions of the plates larger by single stages than the same respectively. Thus, each first floating plate 72 is opposed to a drift region 12 through the field insulating film 16.

The four first floating plates 72 are arranged between the gate electrode plate 18 and the drain electrode plate 21 so that the intervals therebetween are increased in the direction toward the gate electrode plate 18 along the surface of the field insulating film 16.

For example, the first floating plates 72 are so arranged that the interval between the outer periphery of a reference first floating plate 72 and the inner periphery of the first floating plate 72 larger by one stage than the plate is greater than the interval between the inner periphery of the reference first floating plate 72 and the outer periphery of the first floating plate 72 smaller by one stage than the plate.

More specifically, with reference to the first floating plate 72b, the first floating plates 72 are so arranged that the interval $M_2$ between the outer periphery of the plate 72b and the inner periphery of the first floating plate 72a is greater than the interval $M_3$ between the inner periphery of the first floating plate 72b and the outer periphery of the first floating plate 72c.

In the semiconductor device 71, further, five second floating plates 75 are formed on a first interlayer dielectric film 24. All of the second floating plates 75 are formed on the first interlayer dielectric film 24. In other words, all of the second floating plates 75 are formed on the same layer above the first floating plates 72.

Each second floating plate 75 is in the form of a ring similar to the gate electrode plate 18. Therefore, all second floating plates 75 are similar to the first floating plates 72. Each second floating plate 75 has the same width (a constant width) orthogonal to the peripheral direction on any position in the peripheral direction.

All lengths (second peripheral lengths) in the peripheral direction at the centers of the five second floating plates 75 in the width direction are different from one another, and also different from the first peripheral lengths of all first floating plates 72. Further, all of the second peripheral lengths of the five second floating plates 75 are smaller than the gate peripheral length of the gate electrode plate 18.

In the description of the third embodiment, the second floating plates 75 having the different second peripheral lengths may be particularly distinguished from one another as second floating plates 75a to 75e successively from that having the largest second peripheral length.

Widths $N_1$ to $N_5$ of the second floating plates 75a to 75e are entirely equal to one another. In other words, the relational expression: $N_1=N_2=N_3=N_4=N_5$ is satisfied.

The five second floating plates 75 are dividedly arranged one by one between the plates 18, 21 and 72 adjacent to one another in plan view. Thus, the first floating plates 72 and the second floating plates 75 are alternately arranged in plan view between the gate electrode plate 18 and the drain electrode plate 21.

More specifically, the second floating plate 75a having the largest second peripheral length is arranged on a side closer to the gate electrode plate 18, i.e., between the gate electrode plate 18 and the first floating plate 72a. The second floating plate 75b smaller by one stage than the second floating plate 75a is arranged between the first floating plate 72a and the first floating plate 72b. The second floating plates 75c to 75e are also arranged between the plates 21 and 72 adjacent to one another in plan view respectively. The five second floating plates 75 are so arranged that the intervals between the plates 75 adjacent to one another in plan view are equal to one another.

In the semiconductor device 71, as hereinabove described, the width of the first floating plate 72 having a relatively larger first peripheral length is smaller than the width of the first floating plate 72 having a relatively smaller first peripheral length. Further, the first floating plates 72 are arranged between the gate electrode plate 18 and the drain electrode plate 21 so that the intervals therebetween are increased in the direction toward the gate electrode plate 18 along the surface of the field insulating film 16.

In the second floating plates 75, on the other hand, the widths $N_1$ to $N_5$ of the plates 75a to 75e are entirely equal to one another. Further, the second floating plates 75 are alternately arranged with the first floating plates 72 in plan view, and so arranged that the intervals between the plates 75 adjacent to one another in plan view are equal to one another.

Thus, the distance between counter electrodes of each capacitor in plan view can be increased in proportion to the peripheral lengths of the plates forming the counter electrodes.

More specifically, it is assumed that $O_1$ represents the distance between the second floating plate 75a and the gate electrode plate 18 as well as the first floating plate 72a. Further, it is assumed that $O_2$ represents the distance between the second floating plate 75b and the first floating plates 72a and 72b, $O_3$ represents the distance between the second floating plate 75c and the first floating plates 72b and 72c, $O_4$ represents the distance between the second floating plate 75d and the first floating plates 72c and 72d, and $O_5$ represents the distance between the second floating plate 75e and the first floating plate 72d as well as the drain electrode plate 21. In the semiconductor device 71, the relational expression: $O_1>O_2>O_3>O_4>O_5$ can be satisfied in this case.

Therefore, the above relational expression: L/d=constant can be satisfied by adjusting the differences in L (the outer peripheries of the plates) between the capacitors by setting $O_1$ to $O_5$ to proper values.

In a plurality of capacitors having counter electrodes defined by the first floating plates 72 and the second floating plates 75 all having different peripheral lengths (first peripheral lengths and second peripheral lengths), therefore, total capacitances can be equalized with one another.

Consequently, an electric field generated between the counter electrodes of each capacitor can be uniformized, whereby the potential distribution between a source and a drain can be uniformized. Therefore, the withstand voltage can be improved.

While the embodiments of the present invention have been described, the present invention may be embodied in other ways.

For example, the number of the first floating plates 22, 42 or 72 or the second floating plates 25, 45 or 75 may be one or two, or may be not less than four.

In each of the semiconductor devices 1, 41 and 71, the conductivity types of the semiconductor regions may be inverted. In other words, the N-type regions may be replaced with P-type regions, and the P-type regions may be replaced with N-type regions in each of the semiconductor devices 1, 41 and 71.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2008-334481 filed with the Japan Patent Office on Dec. 26, 2008, the disclosure of which is incorporated herein by reference.

What is claimed is:

1. A semiconductor device comprising:
   a semiconductor layer made of a first conductivity type semiconductor material;
   a first conductivity type first impurity region, formed on a surface layer portion of the semiconductor layer, having an impurity concentration higher than the impurity concentration in the semiconductor layer;
   a second conductivity type body region formed on the surface layer portion of the semiconductor layer at an interval from the first impurity region;
   a first conductivity type second impurity region, formed on a surface layer portion of the body region, having an impurity concentration higher than the impurity concentration in the semiconductor layer;
   a field insulating film formed on a portion of the surface of the semiconductor layer between the first impurity region and the second impurity region at an interval from the second impurity region;
   a gate insulating film formed on the surface of the semiconductor layer between the second impurity region and the field insulating film;
   a gate electrode formed on the gate insulating film;
   a first floating plate provided in the form of a ring having a constant width on the field insulating film; and
   a second floating plate provided in the form of a ring having a constant width on the same layer above the first floating plate, wherein
   the first floating plate and the second floating plate are formed by not less than three in total so that the peripheral lengths at the centers in the width direction thereof are entirely different from one another, alternately arranged in plan view so that the one having a relatively smaller peripheral length is stored in an inner region of the one having a relatively larger peripheral length, and formed to satisfy the relational expression: L/d=constant (L: the outer periphery of the inner one of the first and second floating plates adjacent to each other in plan view, d: the distance between the outer periphery of the plate defining L and the inner periphery of the first or second floating plate adjacent to the plate to be opposed to the outer periphery thereof).

2. The semiconductor device according to claim 1, wherein the width of the first floating plate having a relatively larger peripheral length is smaller than the width of the first floating plate having a relatively smaller peripheral length.

3. The semiconductor device according to claim 2, wherein the widths of all of the second floating plates are equal to one another, and the second floating plates are arranged at regular intervals.

4. The semiconductor device according to claim 1, wherein the width of the second floating plate having a relatively larger peripheral length is smaller than the width of the second floating plate having a relatively smaller peripheral length.

5. The semiconductor device according to claim 4, wherein the widths of all of the first floating plates are equal to one another, and the first floating plates are arranged at regular intervals.

6. The semiconductor device according to claim 1, wherein the widths of all of the first floating plates are equal to one another, the widths of all of the second floating plates are equal to one another, and the widths of the first floating plates and the widths of the second floating plates are equal to one another.

* * * * *